United States Patent [19]

Nagahama et al.

[11] Patent Number: 5,424,984
[45] Date of Patent: Jun. 13, 1995

[54] SEMICONDUCTOR MEMORY INCORPORATING A PLURALITY OF DATA INPUT BUFFERS FOR MULTI-BIT OPERATION

[75] Inventors: Yousei Nagahama, Yokohama; Kimimasa Imai, Kawasaki, both of Japan

[73] Assignee: Kabushiki Kaisha Toshiba, Kawasaki, Japan

[21] Appl. No.: 205,796

[22] Filed: Mar. 4, 1994

[30] Foreign Application Priority Data

Mar. 5, 1993 [JP] Japan .................................. 5-045085

[51] Int. Cl.[6] .................................................. G11C 7/00
[52] U.S. Cl. .......................... 365/189.05; 365/189.07; 365/190; 365/201; 365/205; 365/220
[58] Field of Search ................ 365/189.05, 189.07, 365/189.09, 190, 201, 205, 220

[56] References Cited

U.S. PATENT DOCUMENTS

| | | | |
|---|---|---|---|
| 4,669,064 | 5/1987 | Ishimoto | 365/189.05 |
| 4,794,567 | 12/1988 | Akatsuka | 365/189.05 |
| 4,937,479 | 6/1990 | Hoshi | 307/530 |
| 5,134,583 | 7/1992 | Matsuo et al. | 365/200 |
| 5,204,841 | 4/1993 | Chappell et al. | 365/230.05 |
| 5,323,346 | 6/1994 | Takahashi | 365/189.01 |

*Primary Examiner*—Joseph A. Popek
*Assistant Examiner*—Andrew Q. Tran
*Attorney, Agent, or Firm*—Banner, Birch, McKie & Beckett

[57] ABSTRACT

A read-write semiconductor memory comprises a first data input buffer which takes in external data and which has a pair of signal output nodes for outputting a pair of signals corresponding to the taken-in data, a pair of signal lines connected to a pair of signal output nodes of the first data input buffer, and second data input buffers which are connected to the pair of signal lines and which have internal data set according to the signals on the pair of signal lines.

11 Claims, 5 Drawing Sheets

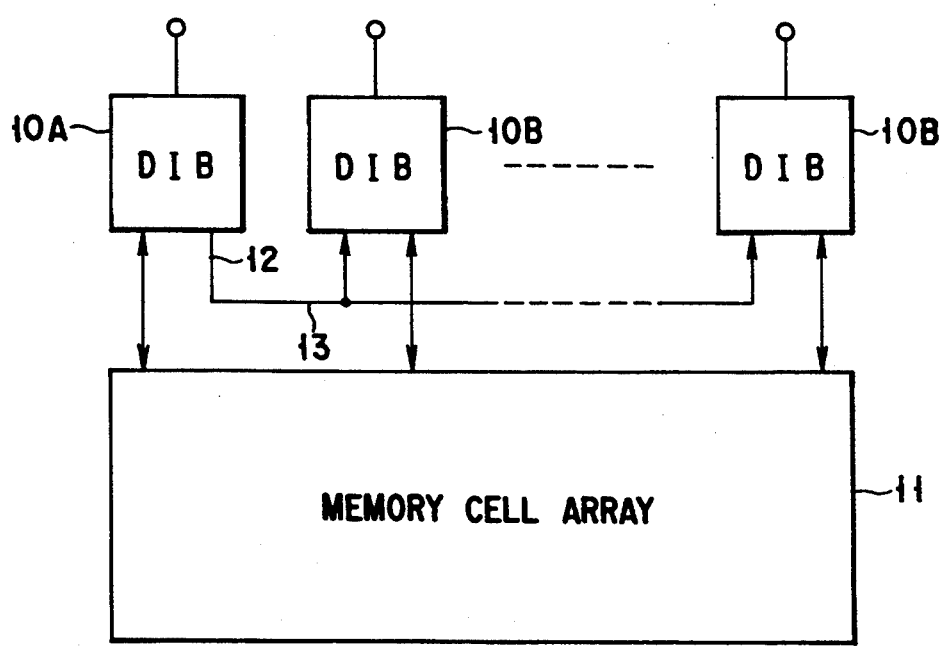
F I G. 2

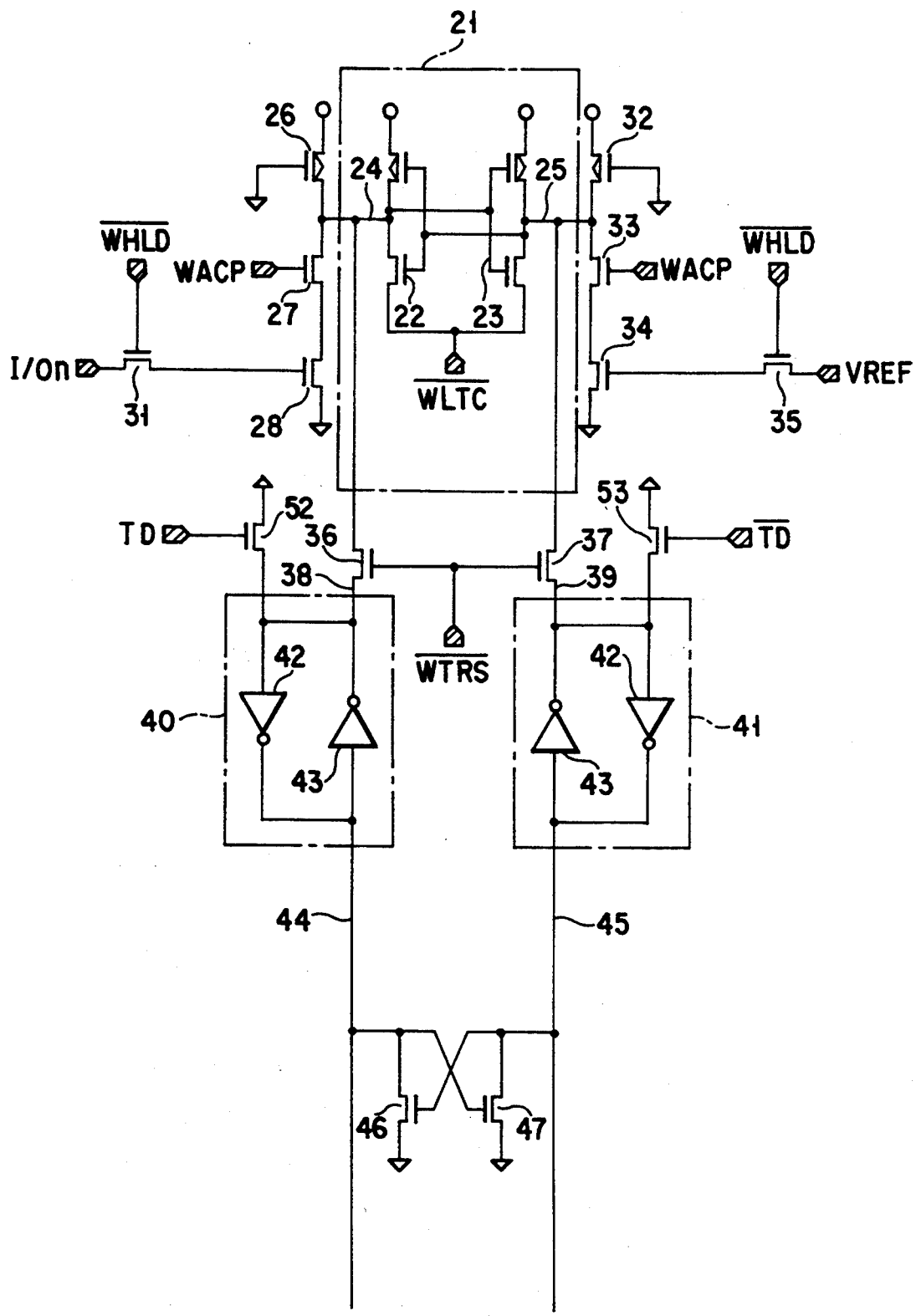
F I G. 4

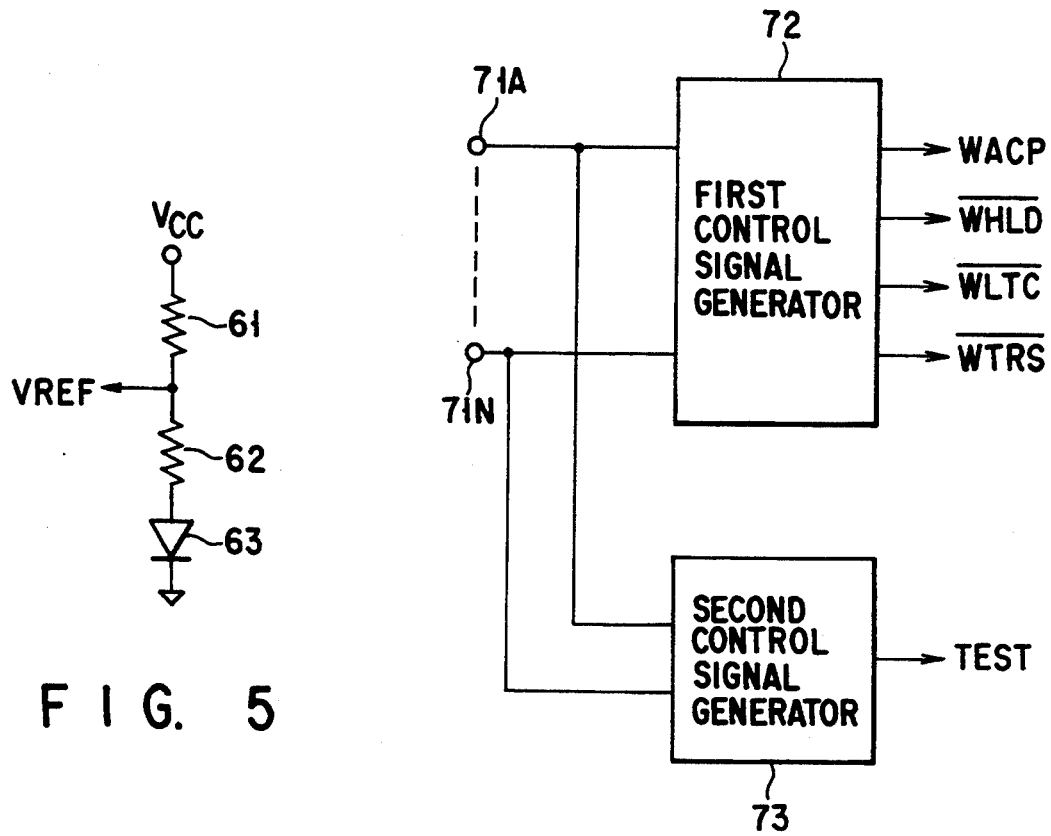
FIG. 5
FIG. 6
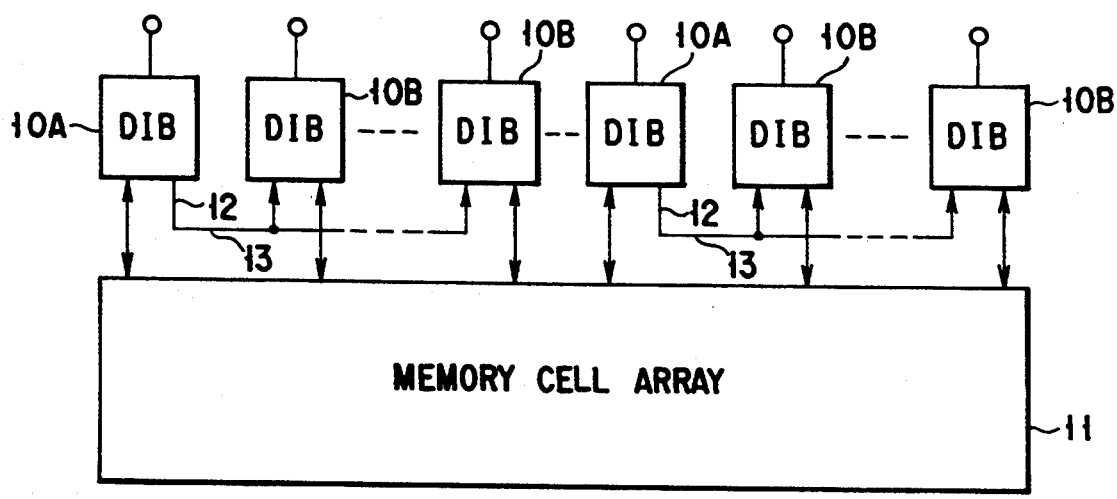
FIG. 8

SEMICONDUCTOR MEMORY INCORPORATING A PLURALITY OF DATA INPUT BUFFERS FOR MULTI-BIT OPERATION

BACKGROUND OF THE INVENTION

1. Field of the Invention

This invention relates to a read-write semiconductor memory such as a DRAM, and more particularly to a semiconductor memory with an external input data taking-in circuit for taking in external data for testing.

2. Description of the Related Art

In the field of semiconductor memories, particularly DRAMs (dynamic random access memories), as their memory capacity has increased and more and more circuits have been squeezed into smaller spaces, a wide variety of DRAMs have been put on the market. Most of conventional general-purpose DRAMs are written into and read from bit by bit or in units of 4 bits. However, now that their access time (or cycle type) has reached the limit, various multi-bit products are being required for processing a large volume of data. In this situation, it is necessary to shorten the testing time and simplify the testing of the product.

As an example of a multi-bit product, a semiconductor memory capable of being written into and read from in units of 4 bit is shown in FIG. 1. The semiconductor memory contains four external input data taking-in circuits (DIB1 to DIB4) (hereinafter, referred to as data input buffers) 10. These four data input buffers 10 have the same internal construction. In the test mode, each of them takes in external data and supplies the data to a memory cell array 11. In the normal operation mode, the data input buffers exchange read and write data with the memory cell array 11.

The memory cell array 11 is composed of DRAM memory cells and a peripheral circuit for controlling the writing and reading of data into and from these memory cells. In the test mode, the data loaded into the individual data input buffers 10 and then written into the memory cell array 11 is read from the memory cell array 11. This read-out data is compared with the original data before writing by a comparison circuit (not shown) to test the memory cells for defects.

Like the case where data is written or read in units of 4 bits, when in a multi-bit product with a small number of parallel bits, data is written in the test mode as in the normal operation mode, no problem is encountered in providing as many data input buffers of the same circuit arrangement as the number of bits and writing data bit by bit independently. Even when the data supplied to an external data input pad is written equally into all the data input buffers to simplify the test, no problem occurs with a multi-bit product with a small number of bits as when data is written or read in units of 4 bits.

However, in the case of multi-bit products with a larger number of bits, an increase in the input capacity becomes a problem. Specifically, because many data input buffers are connected to a single external input pad, the input capacity for the pad increases. The increase in the input capacity elongates the time required to set write data, resulting in an increase in the testing time.

More and more semiconductor memories operating on low voltages, e.g., semiconductor memories operating from a power supply voltage of 3.3 V, will possibly be used in the future with conventional semiconductor memories, however, the data is transferred through the series source-to-drain passes of two n-channel MOS transistors in a data input buffer during the test mode. As a result, also in a normal data write operation, the data is transferred through the source-to-drain passes of two n-channel MOS transistors in the data input buffer. However, in the case of low-voltage products such as semiconductor memories operating from a power supply voltage of 3.3 V, it is difficult to apply a gate voltage high enough to turn on the two MOS transistors properly. This leads to a possibility that the potential of write data will drop by the threshold voltages of the two n-channel MOS transistors. In the data input buffer, however, a reference potential compared with the potential of external data is transferred through the source-to-drain pass of a single n-channel MOS transistor. This permits the reference potential to drop only as much as the threshold voltage of the single n-channel MOS transistor. As a result, depending on conditions, there is a possibility that the opposite of the proper data will be transferred to the memory cell array.

SUMMARY OF THE INVENTION

As described above, conventional semiconductor memories have disadvantages in that the testing time increases and that under conditions of low power-supply voltages, data may be written erroneously.

Accordingly, a first object of the present invention is to provide a semiconductor memory capable of shortening the testing time.

A second object of the present invention is to provide a semiconductor memory capable of preventing data from being written erroneously on low power-supply voltages.

The foregoing objects can be accomplished by providing a read-write semiconductor memory comprising: first data taking-in means which takes in external data and which has at least one signal output node for outputting a signal corresponding to the taken-in data; at least one signal line connected to a signal output node of the first data taking-in means; second data taking-in means which is connected to the signal lines and which has internal data set according to the signals on the signal lines; and data storage means to which the taken-in data from the first data taking-in means and the internal data from the second data taking-in means are supplied and which stores these sets of data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram of a semiconductor memory according to a first embodiment of the present invention;

FIG. 4 is a detailed circuit diagram of the other data input buffer in the semiconductor memory of FIG. 2;

FIG. 5 is a detailed circuit diagram of a reference potential generator circuit in the semiconductor memory of FIG. 2;

FIG. 6 is a detailed circuit diagram of a control signal generator circuit in the semiconductor memory of FIG. 2;

FIG. 8 is a block diagram of a semiconductor memory according to a second embodiment of the present invention.

DETAILED DESCRIPTION OF THE PREFERRED EMBODIMENTS

Hereinafter, embodiments of the present invention will be explained with reference to the accompanying drawings.

FIG. 2 shows a semiconductor memory according to a first embodiment of the present invention.

The semiconductor memory of this embodiment is a DRAM which is written into or read from in units of 4 bits and has four data input buffers. These four data input buffers are of two types: a unique data input buffer 10A and the remaining three data input buffers 10B. These four data input buffers 10A and 10B each take in external data in the test mode and supply the data to a memory cell array 11. In the normal operation mode, they exchange read and write data with the memory cell array 11.

The memory cell array 11 comprises DRAM memory cells and a peripheral circuit for controlling the writing and reading of data into and from these memory cells. In the test mode, the data loaded into the individual data input buffers 10A and 10B and then written into the memory cell array 11 is read from the memory cell array 11. This read-out data is compared with the original data before writing by a comparison circuit (not shown) to test the memory cells for defects.

The unique data input buffer 10A takes in external data in the test mode and holds it. The data input buffer 10A has a pair of signal output nodes 12 for outputting a pair of signals according to the stored data in response to a control signal during the test. The pair of signal output nodes 12 is connected to a pair of signal lines 13. The pair of signal lines 13 is connected to each of the remaining three data input buffers 10B.

Each of the three data input buffers 10B, in the test mode, receives a pair of signals corresponding to the data inputted via the signal lines 13 and has the internal data set according to the signal pair. Also in the test mode, each of the three data input buffers 10B retains the internal data set according to the signal pair and supplies the data to the memory cell array 11. In the normal operation mode, it takes in and holds external data and exchanges read and write data with the memory cell array 11 as does the data input buffer 10A.

Figure 1:
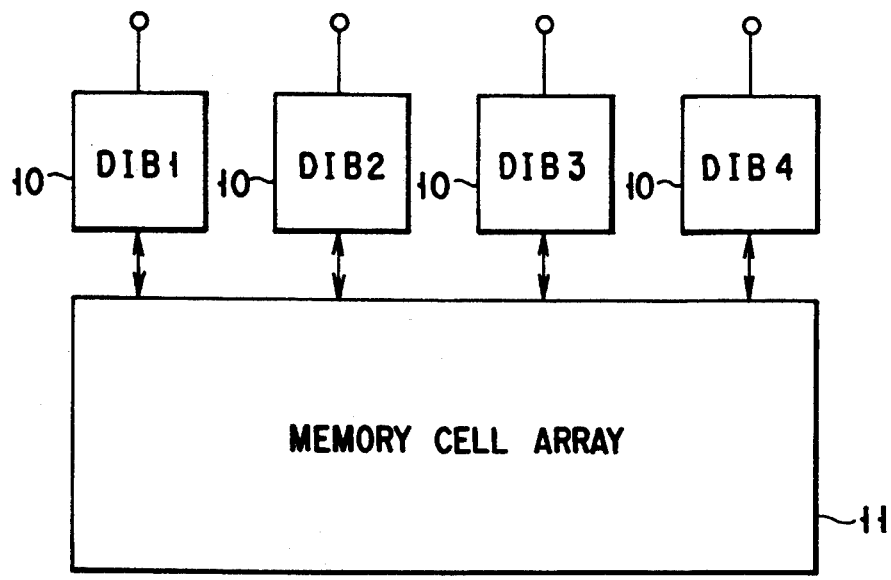
FIG. 1 is a block diagram of a conventional semiconductor memory.
Figure 3:
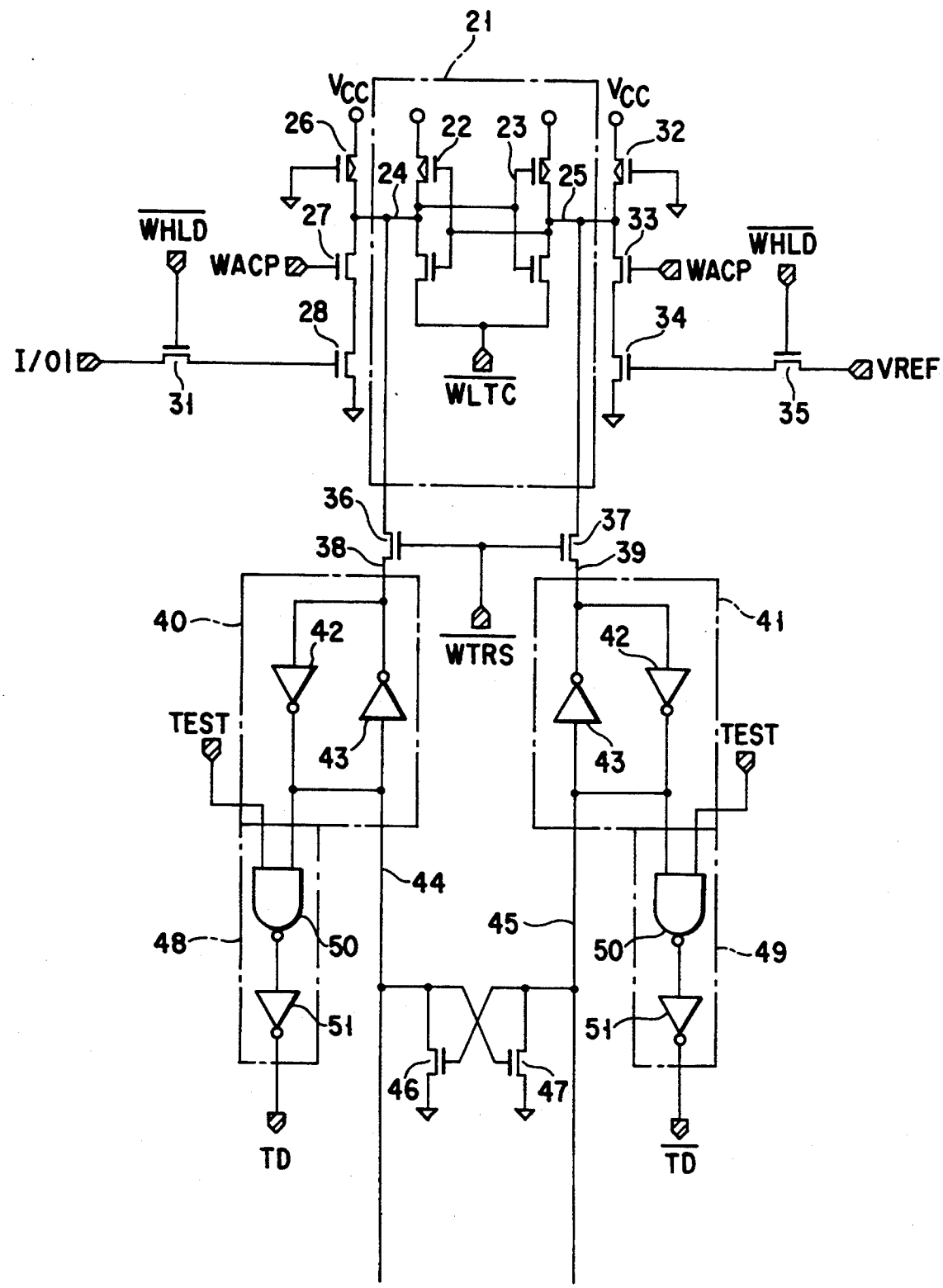
FIG. 3 is a detailed circuit diagram of one data input buffer in the semiconductor memory of FIG. 2.

FIG. 3 shows a detailed arrangement of the data input buffer 10A in FIG. 2. A balanced flip-flop circuit 21 for sensing data is made up of two inverters 22 and 23 whose input and output terminals are cross-coupled, each inverter consisting of a p-channel and an n-channel transistor. The flip-flop circuit 21 is activated by a control signal /WLTC supplied to the common source of the both n-channel MOS transistors. The input terminals of the both inverters 22 and 23 are connected to a pair of input nodes 24 and 25, respectively.

Between one input node 24 of the flip-flop circuit 21 and a power-supply potential Vcc, a source-to-drain pass of a p-channel MOS transistor 26 whose gate is connected to the ground potential is inserted. Between the node 24 and the ground potential, a source-to-drain pass of an n-channel MOS transistor 27 whose gate is supplied with a control signal WACP and that of an n-channel MOS transistor 28 are inserted in series. Between the gate of the n-channel MOS transistor 28 and a node to which external data I/01 is supplied, a source-to-drain pass of an n-channel MOS transistor 31 is inserted. The gate of the MOS transistor 31 is controlled by a control signal /WHLD.

Between the other input node 25 of the flip-flop circuit 21 and the power-supply potential Vcc, a source-to-drain pass of a p-channel MOS transistor 32 whose gate is connected to the ground potential is inserted. Between the node 25 and the ground potential, a source-to-drain pass of an n-channel MOS transistor 33 whose gate is supplied with the control signal WACP and that of an n-channel MOS transistor 34 are inserted in series. Between the gate of the n-channel MOS transistor 34 and a node to which a reference potential VREF is supplied, a source-to-drain pass of an n-channel MOS transistor 35 is inserted. The gate of the MOS transistor 35 is controlled by the control signal /WHLD.

The input nodes 24 and 25 of the flip-flop circuit 21 are connected to nodes 38 and 39 via the source-to-drain passes of a pair of n-channel MOS transistors 36 and 37, respectively, whose gates are each supplied with a control signal /WTRS.

The nodes 38 and 39 are connected to latch circuits 40 and 41, respectively. These latch circuits 40 and 41 have the same configuration, each consisting of two inverters 42 and 43 whose input and output nodes are cross-coupled. Specifically, in one latch circuit 40, node 38 is connected to the input node of inverter 42, the output node of inverter 42 is connected to the input node of inverter 43, and the output node of inverter 43 is connected to the input node of inverter 42. The other latch circuit 41 is also wired in the same way. Between the output nodes 44 and 45 of the latch circuits 40 and 41 and the ground potential, source-to-drain passes of n-channel MOS transistors 46 and 47 are connected respectively, wherein the gate of one MOS transistor 46 is connected to the output node 45 of the latch circuit 41, and the gate of the other MOS transistor 47 is connected to the output node 44 of the latch circuit 40.

The output nodes 44 and 45 of the latch circuits 40 and 41 are connected to signal output circuits 48 and 49, respectively. The signal output circuits 48 and 49 have the same configuration and each comprise a NAND gate 50 to which the signal from the output nodes 44 and 45 of the latch circuits 40 and 41 and a control signal TEST are supplied, and an inverter 51 for inverting the output of the NAND gate 50. Then, the signals TD and /TD from the signal output circuits 48 and 49 are supplied to the three data input buffers 10B via the signal lines 13 in FIG. 2.

FIG. 4 shows a detailed arrangement of one of the remaining data buffers 10B in FIG. 2. Because those data input buffers 10B is almost the same as the data input buffer 10A in arrangement, only the things in which the former differ from the latter will be explained. Between the gate of the n-channel MOS transistor 28 and a node to which external data I/On (n=2, 3, 4) is supplied, a source-to-drain pass of an n-channel MOS transistor 31 is inserted. Between the input nodes 38 and 39 of the latch circuits 40 and 41 and the ground potential, a source-to-drain pass of data setting n-channel MOS transistor 52 and 53 are connected, respectively. Then, the gate of the n-channel MOS transistor 52 of the latch circuit 40 is supplied with one signal TD sent via the signal line 13, while the gate of the n-channel MOS transistor 53 of the latch circuit 41 is supplied with the other signal /TD sent via the signal line 13.

FIG. 5 shows an example of a reference potential generator circuit for generating a reference potential VREF used in the data input buffers 10A and 10B. In the reference potential generator circuit, two resistors 61 and 62 and the anode-to-cathode pass of a diode 63 are connected in series between the power-supply potential Vcc and the ground potential. The reference potential VREF is obtained at the connection point of the resistors 61 and 62.

FIG. 6 shows an example of a control signal generator circuit for generating various control signals used in the embodiment circuit. The signals at external input pads 71A to 71N are supplied to a first control signal generator circuit 72. The first control signal generator circuit 72 activates the control signals WACP, /WHLD, /WLTC, and/WTRS on the basis of a combination of the signals supplied to the pads 71A to 71N and their levels. Some (e.g., the signals at 71A and 71N) of the signals supplied to the external pads 71A to 71N are also supplied to a second control signal generator circuit 73. The second control signal generator circuit 73 activates the control signal TEST on the basis of the levels of the signals supplied to the pads 71A and 71N.

Figure 7:
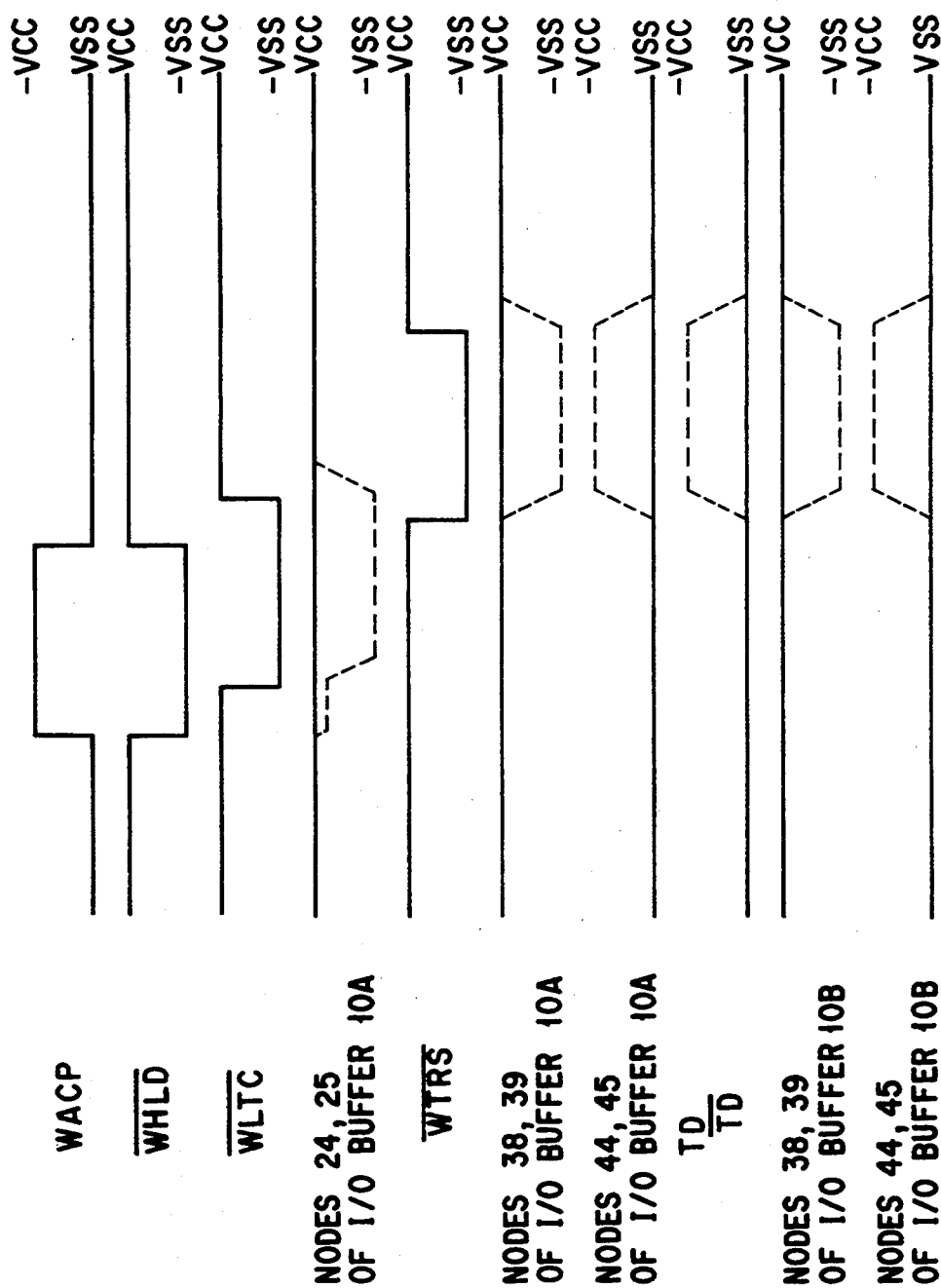
FIG. 7 is a timing chart to help explain an example of the operation of the semiconductor memory of FIG. 2.

The operation of the semiconductor memory of the embodiment in the test mode will be described using the timing chart of FIG. 7. In the test mode, the control signal TEST from the second control generator circuit 73 of FIG. 6 goes high. The reference potential generator circuit of FIG. 5 produces a reference potential VREF of approximately 1.6 V. At this time, an external data input pad is connected only to the node for external data I/O1 of the data input buffer 10A to write the external data. For example a "1" level is assumed to be written as external data. At this time, none of the nodes for I/On (n=2, 3, 4) of the data input buffers 10B are connected to external data input pads, thus placing them in a floating state. As a result, only the data input buffer 10A takes in the correct external data.

When the DRAM starts a write operation, the control signal /WHLD goes low in the data input buffer 10A, which turns off the n-channel MOS transistors 31 and 35, thus confining the potential at the node for I/O1 and the reference potential VREF to the gates of the n-channel MOS transistors 28 and 34 respectively. At this time, the control signal WACP goes high, which turns on the n-channel MOS transistors 27 and 33, thus allowing the potentials corresponding to the potential at the node for I/O1 and the reference potential VREF to be supplied to the input nodes 24 and 25 of the flip-flop circuit 21 respectively. After this, the control signal /WLTC goes low, activating the flip-flop circuit 21. The flip-flop circuit 21 compares the potentials corresponding to the potential at the node for I/O1 and the reference potential VREF, and makes the potential difference between nodes 24 and 25 larger. Then, during the time when the control signal/WTRS is high, the signals at the nodes 24 and 25 are transferred to the input nodes 38 and 39 of the latch circuits 40 and 41 via the n-channel MOS transistors 36 and 37, respectively.

After this, the control signal /WRTS goes low, which turns off the n-channel MOS transistors 36 and 37, thus allowing the signals at the nodes 38 and 39 to be latched in the latch circuits 40 and 41. The latched data is outputted to the nodes 44 and 45. Then, the control signal /WLTC goes high, thereby completing the potential comparing operation at the flip-flop circuit 21.

Because in the test mode, the control signal TEST is high, the output signals from the latch circuits 40 and 41 are inverted at the corresponding NAND gates 50 of the signal output circuits 48 and 49, respectively, in the data input buffer 10A. The output signals from the NAND gates 50 are further inverted at the corresponding inverters 51, which then outputs signals TD and /TD, respectively. Here, if a "1" level is supplied as external data to the node for I/O1 of the data input buffer 10A as described above, the output signal TD from the signal output circuit 48 will go high and the other output signal /TD will go low.

Because in the remaining data input buffers 10B, the node for I/On has been in a floating state up to this point, the latch circuits 40 and 41 attempt to latch indefinite data. However, when the output signals TD and /TD from the signal output circuit 48 and 49 are determined to be high and low respectively, the n-channel MOS transistor 52 connected to the input node 38 of the latch circuit 40 turns on. This forces the input node 38 of the latch circuit 40 to drop to the ground potential, thus causing the latch circuit 40 to latch data so that the input node 38 may go low and the output node 44 may go high.

On the other hand, the n-channel MOS transistor 53 connected to the input node 39 of the latch circuit 41 in each data input buffer 10B is off, thus allowing the input node 39 of the latch circuit 41 to remain indefinite. However, when the output node 44 of the latch circuit 40 is determined to be high, this turns on the n-channel MOS transistor 47, thus placing the output node 45 of the latch circuit 41 at the ground potential. This causes the latch circuit 41 to latch data so that the output node 45 may go low and the input node 39 may go high.

Accordingly, the data "1" supplied to the node for I/O1 is written equally into all the data input buffers. After this, according to an external address, the data is written in a particular memory cell in the memory cell array 11.

Because when in the test mode, common data is written into all the data input buffers, the external data has to be supplied to the single data input buffer 10A only, there is no possibility that the input capacity of the external input pad will increase as found in conventional equivalents. As a result, it is possible to shorten the time required to set write data and consequently prevent the increase of the testing time.

On the other hand, in the DRAM of the embodiment, the control signal TEST is made low in the normal operation mode by the second control signal generator circuit 73 of FIG. 6. At this time, the NAND gates 50 of the signal output circuits 48 and 49 in the data input buffer 10A go high, and the output signals, or signals TD and /TD, from the inverters 51 following the NAND gates go low. This turns off all the n-channel MOS transistors 52 and 53 supplied with the both signal TD and /TD in each data input buffer 10B. As a result, the latch circuits 40 and 41 in each data input buffer 10B can latch the signals at the input nodes 38 and 39 respectively. In the normal operation mode, the write data and the reference potential VREF are allowed to pass through the source-to-drain passes of the respective n-channel MOS transistors 31 and 35, and are supplied to the gates of the n-channel MOS transistors 28 and 34 respectively. Accordingly, in the case of low-voltage products operating from a power supply voltage of 5 V or less, a voltage drop in the write data is equal to the threshold voltage of a single n-channel MOS transistor as is a voltage drop in the reference potential VREF. Thus, it is much less likely that the opposite of the proper data will be written into the memory cell array as found in a conventional equivalent. As a result, it is possible to prevent data from being written erroneously at a low power-supply voltage.

FIG. 8 is a block diagram of a semiconductor memory according to a second embodiment of the present invention with the first embodiment, in the test mode, external data is supplied only to a particular single data input buffer 10A among a plurality of data input buffers, and the internal data is set in all the remaining data input buffers 10B according to the output signal from the data input buffer 10A. In contrast, with the memory of the second embodiment, the data input buffer 10 is divided into a plurality of blocks and each block is provided with a data input buffer 10A directly supplied with external data from an external data input pad and a data input buffer 10B into which data is set according to the output signal from the data input buffer 10A. This arrangement makes it possible to write the same data into groups of data input buffers.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A read-write semiconductor memory comprising:
   a first data input buffer circuit for receiving first external data and outputting at least one signal corresponding to the first external data to at least one signal output node in response to a first control signal;
   at least one signal line connected to said at least one signal output node;
   a second data input buffer circuit, connected to said at least one signal line, for receiving second external data and setting internal data according to said at least one signal on said at least one signal line; and
   data storage means for receiving and storing the first external data received by said first data input buffer circuit and the internal data from said second data input buffer circuit.

2. A read-write semiconductor memory according to claim 1, wherein said first data input buffer circuit and said second data input buffer circuit each includes:
   a data sensing circuit for comparing an external data potential with a reference potential to sense the corresponding first or second external data; and
   a data holding circuit for receiving the data sensed at said data sensing circuit and holding the sensed data.

3. A read-write semiconductor memory according to claim 2, wherein each data holding circuit is a latch circuit including:
   a first node for receiving the sensed data from said data sensing circuit;
   a first signal inversion circuit having an input node connected to said first node; and
   a second signal inversion circuit having an input node connected to an output node of said first signal inversion circuit and an output node connected to the input node of said first signal inversion circuit.

4. A read-write semiconductor memory according to claim 2, wherein said first data input buffer circuit further includes a signal output circuit for outputting said at least one signal, said at least one signal corresponding to the sensed data held in said data holding circuit in response to the first control signal.

5. A read-write semiconductor memory according to claim 2, wherein said second data input buffer circuit further includes a data setting circuit for setting the sensed data held in said data holding circuit on the basis of said at least one signal inputted via said at least one signal line.

6. A read-write semiconductor memory according to claim 4, wherein said signal output circuit receives the sensed data held by said data holding circuit and said first control signal, and outputs said at least one signal having a level which corresponds to the sensed data.

7. A read-write semiconductor memory according to claim 5, wherein said data setting circuit is a switch circuit which is inserted between a first node of said data holding circuit and a first potential which undergoes on and off control according to said at least one signal on said at least one signal line.

8. A read-write semiconductor memory according to claim 2, wherein said data sensing circuit senses the corresponding first or second external data and generates complementary data signals.

9. A read-write semiconductor memory according to claim 2, wherein said data sensing circuit includes:
   a first input node for the corresponding first or second external data;
   a second input node for said reference potential;
   amplifying means having a pair of potential input nodes for amplifying a potential difference between said pair of potential input nodes;
   first switch means inserted between said first input node and one potential input node of said amplifying means and which undergoes on and off control in response to a second control signal; and
   second switch means inserted between said second input node and the other potential input node of said amplifying means and which undergoes on and off control in response to said second control signal.

10. A read-write semiconductor memory according to claim 1, wherein in a normal operation mode, said second data input buffer circuit receives the second external data, holds the second external data, and exchanges read and write data with said data storage means.

11. A read-write semiconductor memory according to claim 1, wherein during a test mode, said second data input buffer circuit sets the internal data according to the at least one signal.

* * * * *